United States Patent
Blosse et al.

(10) Patent No.: US 7,396,773 B1
(45) Date of Patent: Jul. 8, 2008

(54) METHOD FOR CLEANING A GATE STACK

(75) Inventors: Alain Blosse, Belmont, CA (US); Krishnaswamy Ramkumar, San Jose, CA (US)

(73) Assignee: Cypress Semiconductor Company, San Jose, CA (US)

( * ) Notice: Subject to any disclaimer, the term of this patent is extended or adjusted under 35 U.S.C. 154(b) by 392 days.

(21) Appl. No.: 10/313,283

(22) Filed: Dec. 6, 2002

(51) Int. Cl.
 *H01L 21/302* (2006.01)
(52) U.S. Cl. .................. 438/747; 438/750; 438/753; 438/754
(58) Field of Classification Search .............. 438/745, 438/747, 750, 753, 754
 See application file for complete search history.

(56) References Cited

U.S. PATENT DOCUMENTS

| | | | | |
|---|---|---|---|---|
| 6,117,795 A * | 9/2000 | Pasch | ...................... | 438/745 |
| 6,180,453 B1 * | 1/2001 | Sung et al. | .................. | 438/256 |
| 6,194,128 B1 * | 2/2001 | Tao et al. | .................... | 430/313 |
| 6,278,129 B1 * | 8/2001 | Sugasawara et al. | .......... | 257/48 |
| 6,303,482 B1 * | 10/2001 | Wu et al. | .................... | 438/592 |
| 6,448,140 B1 * | 9/2002 | Liaw | ......................... | 438/279 |
| 6,479,405 B2 * | 11/2002 | Lee et al. | .................... | 438/782 |
| 6,506,647 B2 * | 1/2003 | Kuroda et al. | .............. | 438/275 |
| 2004/0072441 A1 * | 4/2004 | Hall | .......................... | 438/710 |

OTHER PUBLICATIONS

Van Der Puy et al., Hydroxylamine, Redox Properties of Hydroxylamines Part 1. Inorganic Reaction (Buffalo Research Laboratory), pp. 1-10.*
Material Safety Data Sheet, EKC Technology, Product Name: EKC265™, pp. 1-10, 2004.*
Encyclopedia of Chemical Technology, Kirk-Othmer, vol. 14, pp. 677-709 (1995).
Diaz, C.H., H. Tao, Y. Ku, A. Yen, and K. Young, 2001. "An Experimemtally Validated Analytical Model For Gate Line-Edge Roughness (LER) Effects on Technology Scaling", IEEE Electron Device Letters, 22(6)287-289.

* cited by examiner

*Primary Examiner*—Binh X Tran
(74) *Attorney, Agent, or Firm*—Evan Law Group LLC

(57) ABSTRACT

A method of making a semiconductor structure, comprises cleaning a gate stack with a cleaning solution. The gate stack comprises a gate layer, a metallic layer on the gate layer, and a etch-stop layer on the metallic layer. The gate layer is on a semiconductor substrate, the cleaning solution is a non-oxidizing cleaning solution, and the metallic layer comprises an easily oxidized metal.

22 Claims, 5 Drawing Sheets

METHOD FOR CLEANING A GATE STACK

BACKGROUND

Modern integrated circuits are constructed with up to several million active devices, such as transistors and capacitors, formed in and on a semiconductor substrate. Interconnections between the active devices are created by providing a plurality of conductive interconnection layers, such as polycrystalline silicon and metal, which are etched to form conductors for carrying signals. The conductive layers and interlayer dielectrics are deposited on the silicon substrate wafer in succession, with each layer being, for example, on the order of 1 micron in thickness.

A gate structure is an element of a transistor. FIG. 1 illustrates an example of a gate stack 8. A semiconductor substrate 10 supports a gate insulating layer 16, which overlaps doped regions (source/drain regions) in the substrate (12 and 14), and the gate insulating layer supports a gate 18, which is typically polycrystalline silicon. On the gate is a metallic layer 30. The metallic layer may be separated from the gate by one or more other layers, such as nitrides, oxides, or silicides, illustrated collectively as barrier layer 20. The metallic layer may in turn support one or more other layers (collectively 40), such as nitrides, oxides, or silicides. Oxide 22 may be formed on the sides of the gate to protect the gate oxide at the foot of the gate stack; and insulating spacers 24 may be formed on either side of the gate stack. Furthermore, contacts to the source/drain regions in the substrate, and to the gate structure, may be formed.

Self-aligned contacts (SAC) allow the design of a semiconductor device to have a distance between the gate and the via contact to the substrate, to be at most one-half the minimum gate width. Typically, SAC uses a nitride layer on the gate stack, together with spacers that include nitride, to prevent a misaligned contact from contacting the gate itself. If the nitride were not present, then the etch used to form the hole which will become the contact would pass through the dielectric layer all the way to the gate. When present, the nitride layer and spacers acts as an etch stop, preventing misalignment form forming a hole all the way to the gate, and therefore allowing design of the device to have a much smaller average distance between the contact and the gate.

The nitride layer on the gate stack has at least a thickness of 800 angstroms when used for forming SAC. If used only for other purposes, such as an etch-stop layer or a hard mask, a thickness of less than 800 angstroms is used. Also, the thickness of at least 800 angstroms is the thickness after the dielectric layer has been formed; the nitride layer is usually thicker when originally formed, allowing for a loss of about 500 angstroms during the gate etch (i.e. thickness for the hard mask function), and a loss of about 200 angstroms during nitride spacer formation.

There is an ongoing need to reduce the size of the elements within integrated circuits and semiconductor structures. As the size of an element is reduced, it becomes more likely that irreversible changes will occur in the compositions of the various layers and regions within an element. These changes are typically related to diffusion, which is dependent on the elevated temperatures used for processing and the length of time the temperatures are maintained. Furthermore, chemical reaction which did not interfere with device reliability in earlier devices, may have a profound impact as the structures are reduced in size. Also, mechanical stability is reduced, requiring new techniques to prevent damage during processing. It is thus desirable to perform processing at cooler temperatures and/or to reduce the time, or under milder conditions than in the past.

BRIEF SUMMARY

In a first aspect, the present invention is a method of making a semiconductor structure, comprising cleaning a gate stack with a cleaning solution. The gate stack comprises a gate layer, a metallic layer on the gate layer, and a etch-stop layer on the metallic layer. The gate layer is on a semiconductor substrate, the cleaning solution is a non-oxidizing cleaning solution, and the metallic layer comprises an easily oxidized metal.

In a second aspect, the present invention is a method of making a semiconductor structure, comprising cleaning a gate stack comprising a metallic layer with a solution. The metallic layer is on a gate layer, the gate layer is on a semiconductor substrate, and a etch-stop layer is on the metallic layer. The metallic layer comprises tungsten, and the cleaning solution comprises (a) an amino alkoxy alcohol having 2-12 carbon atoms, (b) an aromatic diol or triol, and (c) hydroxylamine or an alkylhydroxyl amine containing 1-6 carbon atoms.

In a third aspect, the present invention is a method of making a semiconductor structure, comprising removing photoresist. The photoresist is on a etch-stop layer, the etch-stop layer is on a metallic layer, the metallic layer is on a gate layer, and the gate layer is on a semiconductor substrate. The removing comprises applying a cleaning solution comprising: (a) an amino alkoxy alcohol having 2-12 carbon atoms, (b) an aromatic diol or triol, and (c) hydroxylamine or an alkylhydroxyl amine containing 1-6 carbon atoms.

DETAILED DESCRIPTION

As devices are reduced in size, the resistance of the polysilicon typically used in the gate stack become too large. Metallic layers may be added to reduce the resistance, but these metals are either incompatible chemically with other material, such as the polysilicon, or are chemically reactive with existing processes. For example, photoresist is removed by ashing followed by washing with $H_2SO_4$ and $H_2O_2$. Tungsten is compatible with most of the processing of semiconductor devices, but is easily oxidized during cleaning steps which use these oxidizing chemicals, such as $H_2SO_4$ and $H_2O_2$. This is particularly problematic as the critical dimension approaches 0.4 nm; delamination of the tungsten often results.

The present invention makes use of the discovery that non-oxidizing cleaning solutions, which do not contain substantial amounts $H_2SO_4$ and $H_2O_2$, such as cleaning solutions containing water, 2-(2 aminoethoxy)ethanol, hydroxylamine, and catechol, may be used to clean easily oxidized metals, such as tungsten and tungsten nitride. These cleaning solutions may be used for any cleaning where these metals are exposed, such as cleaning gate stacks, and cleaning contacts (for example, after a SAC etch).

An "easily oxidized metal" is a metal, alloy, or metallic compound, having a conductivity greater than highly doped polysilicon, that is oxidized by mixtures of $H_2SO_4$ and $H_2O_2$, and their solutions, which are used for removing photoresist after ashing. Examples of easily oxidized metals are tungsten and tungsten nitride.

A "non-oxidizing cleaning solution" is any mixture that when used after a plasma ashing described in the example, will remove photoresist residue, but will not result in delamination or substantial oxidation of tungsten or tungsten nitride in the following gate stack: silicon nitride layer (top) having a thickness of 1300 angstroms, a tungsten layer having a thickness of 325 angstroms, a tungsten nitride layer having a thickness of 75 angstroms, and a polysilicon layer (bottom) having a thickness of 800 angstroms. An example of a non-oxidizing cleaning solution is EKC265™ (EKC, Hayward, Calif.).

The present invention includes cleaning a semiconductor structure containing an exposed metallic material or layer with a cleaning solution. The present invention is particularly suited to forming a semiconductor structure having a metallic layer which is susceptible to easy oxidation, such as a gate stack containing tungsten. Also, the cleaning can be carried out with low mechanical force to avoid damaging thin gate stacks.

Figure 1:
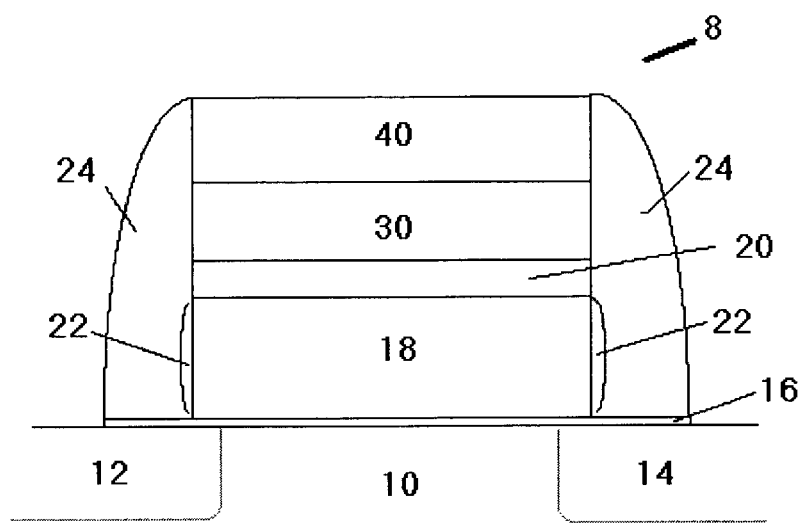
FIG. 1 shows a gate stack structure.
Figure 2:
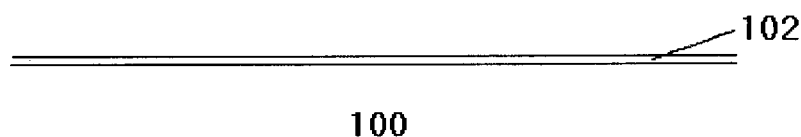
FIGS. 2-8 illustrate a method of forming the structure of FIG. 9.

Referring to FIG. 2, a gate insulating layer 102 is on a semiconductor substrate 100. The semiconductor substrate may be a conventionally known semiconductor material. Examples of semiconductor materials include silicon, gallium arsenide, germanium, gallium nitride, aluminum phosphide, and alloys such as $Si_{1-x}Ge_x$ and $Al_xGa_{1-x}As$, where $0 \leq x \leq 1$. Preferably, the semiconductor substrate is silicon, which may be doped or undoped. The gate insulating layer 102 may be a conventionally known insulating material. For example, the gate insulating layer may contain silicon oxide or silicon oxynitride.

Figure 3:
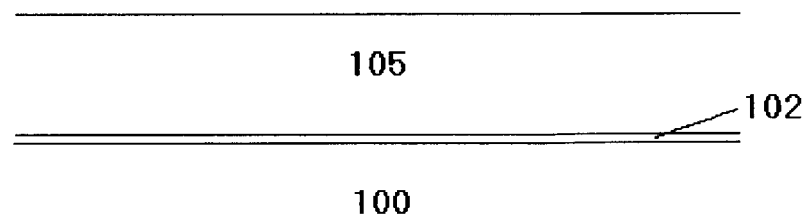

Referring to FIG. 3, a gate layer 105 may be formed on the gate insulating layer. The gate layer may contain a variety of semiconducting materials. Typically, a gate layer contains polycrystalline silicon (poly) or amorphous silicon. The gate layer may be doped with one type of dopant ($P^+$ or $N^+$), or it may contain both types of dopants in discrete regions. A split gate is a gate layer containing both $P^+$ and $N^+$ doping regions.

In the case of a split gate, those regions of the gate that are $P^+$ doped (such as with B or $BF_2^+$) are over $N^-$ doped channel regions of the substrate, forming a PMOS device; those regions of the gate that are $N^+$ doped (such as with $As^+$ or $phosphorus^+$) are over $P^-$ doped channel regions of the substrate, forming an NMOS device. The $P^+$ and $N^+$ doping regions of the gate are separated by a region which is on an isolation region of the substrate; this isolation region has a width of at most 0.4 microns, more preferably at most 0.36 microns. The doping of the regions of the gate is preferably carried out after forming the gate, by masking and doping each region separately, or by an overall doping of the gate with one dopant type, and then masking and doping only one region with the other dopant type (counter doping).

Figure 4:
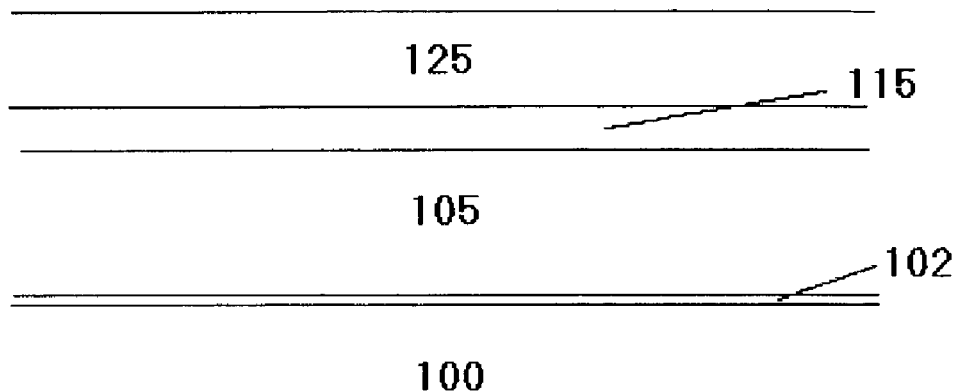

Referring to FIG. 4, a barrier layer 115 may optionally be formed on the gate layer. The optional barrier layer may contain a variety of materials, including nitrides, silicides, and oxides, and is preferably a conductive material. For example, the barrier layer may contain refractory silicides and nitrides. Preferably, the barrier layer contains silicon nitride, or a nitride or silicide of a metal such as tantalum, titanium, niobium or tungsten, for example tungsten nitride.

Referring still to FIG. 4, a metallic layer 125 may be formed on the gate layer, or the barrier layer 115, if it is present. Preferably, the metallic layer has a thickness of 200-600 angstroms, more preferably 300-500 angstroms, most preferably 325-450 angstroms. The metallic layer 125 may contain a variety of metal-containing materials. For example, a metallic layer may contain aluminum, copper, tantalum, titanium, tungsten, or alloys or compounds thereof. Preferably, the metallic layer comprises tungsten or titanium. The metallic layer may be formed, for example, by physical vapor deposition (PVD) of the metal, or by low pressure chemical vapor deposition (LPCVD) of a mixture of a metal halide and hydrogen.

Figure 5:
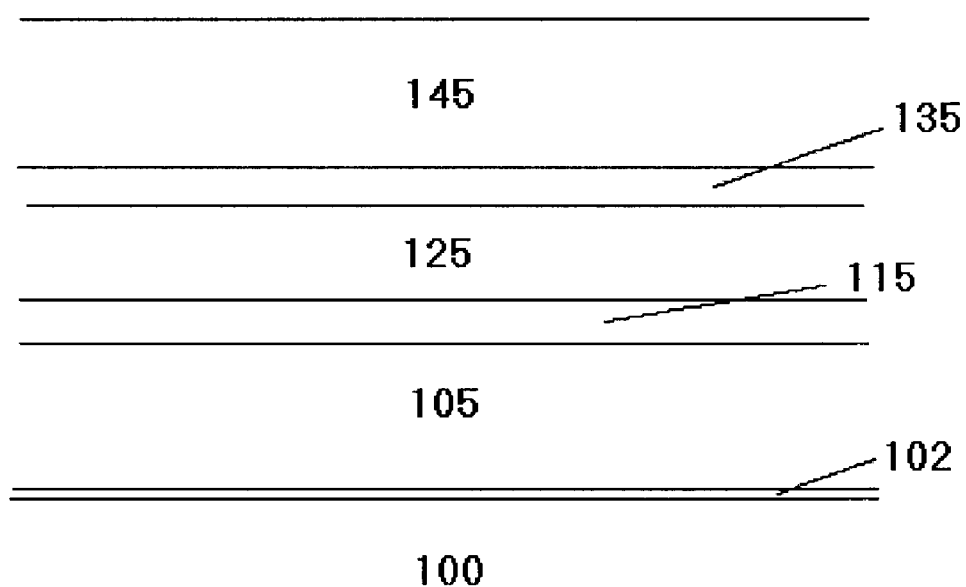

Referring to FIG. 5, a barrier layer 135 may optionally be formed on the metallic layer. The formation of the second optional barrier layer may be performed as described for the first optional barrier layer 115, and this layer may be formed of the same materials, and to the same thicknesses.

Referring still to FIG. 5, an etch-stop layer 145 may be formed on the metallic layer by a variety of methods, including chemical vapor deposition (CVD). Preferably, the etch-stop layer is a nitride layer. More preferably, the etch-stop layer is silicon nitride formed by PECVD. The etch-stop layer may vary in composition, so that the top of the etch-stop layer is anti-reflective, for example so that the top of the etch-stop layer is silicon rich silicon nitride, or silicon oxynitride; this layer may also act as a hard mask to protect the etch-stop layer during subsequent etches. Alternatively, a separate anti-reflective layer (ARC) may be formed.

Preferably, the etch-stop layer is formed rapidly at a relatively low temperature. For example, if the gate layer contains both $P^+$ and $N^+$ doping regions, diffusion of the dopants may occur if the wafer is maintained at sufficiently high temperatures for a prolonged period of time. Thus, it is desirable that any high temperature processing is performed only for relatively short periods of time. Likewise, it is desirable that any lengthy processing is carried out at relatively low temperatures. Preferably, the etch-stop layer is formed at a temperature of at most 750° C., if the atmosphere is substantially devoid of oxygen, or in a reducing environment (hydrogen rich). Under typical conditions, a temperature of at most 600° C. is preferred, at most 450° C. is more preferred. A temperature of at least 350° C. is preferred, such as 400° C. The depositing of the etch-stop layer is preferably carried out at a temperature and for a time that does not result in substantial diffusion between the $P^+$ region and the $N^+$ region in a split gate.

Preferably, the etch-stop layer has a thickness of at least 800 angstroms, more preferably a thickness of at least 1100 angstroms, most preferably a thickness of at least 1200, after etching of the gate layer, and after formation of gate spacers. About 500 angstroms of etch-stop may be lost during the gate layer etch, and about 200 angstroms of etch-stop may be lost during the spacer formation. Preferably, at least 1500 angstroms thickness of etch-stop are deposited, more preferably at least 1800 angstroms thickness of etch-stop are deposited, most preferably 2100 angstroms thickness of etch-stop are deposited. Preferably, after the gate layer etch and after spacer formation (or, alternatively, after the dielectric layer is formed), the etch-stop layer has a thickness of 800-1800 angstroms, more preferably a thickness of 1100-1500 angstroms, most preferably a thickness of 1200-1400 angstroms. Similarly, the thickness deposited would preferably be these same ranges, with an additional 700 angstroms added to accommodate loss during the gate layer etch and spacer formation, when material are used which may result in a loss of the etch-stop layer at these points in the process.

Figure 6:
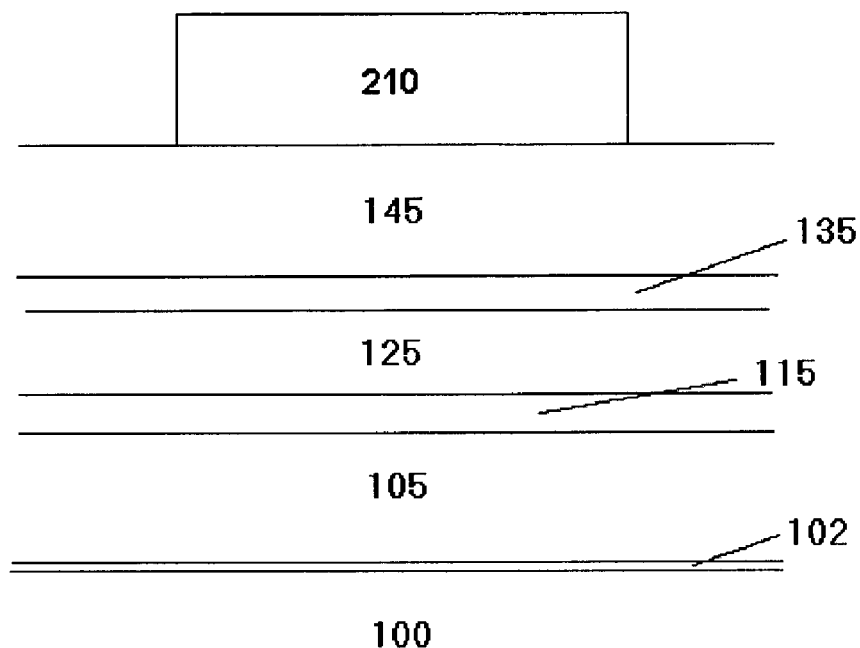
Figure 7:
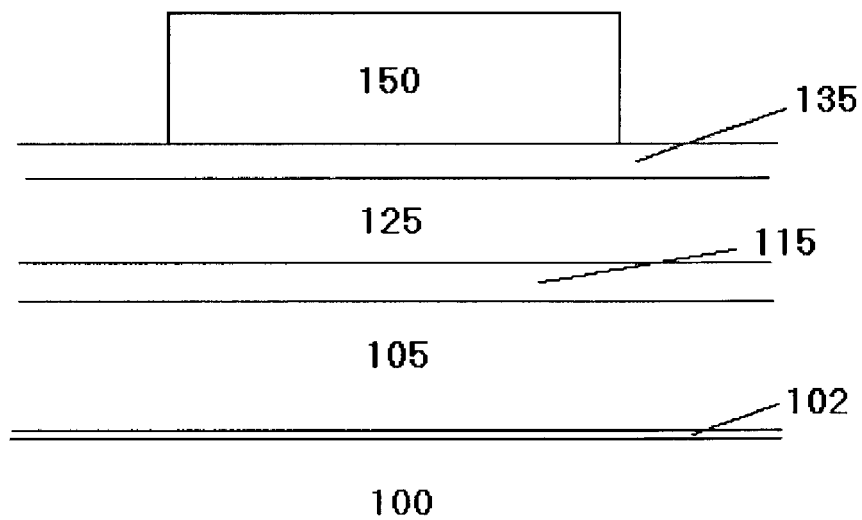

Referring to FIGS. 6-9, each layer may be patterned to form the gate stack. The patterning may be accomplished, for example, by conventional photolithographic and etching techniques. Referring to FIGS. 6 and 7, the etch-stop layer may be etched to form a patterned etch-stop layer 150, for example by forming a patterned photoresist 210 on etch-stop layer 145 (FIG. 6) and then etching the exposed portions of the layer. The etch-stop etching may be carried out by conventional etching techniques, for example by exposure to a plasma formed from a mixture of $CF_4$ and $CHF_3$.

Figure 8:
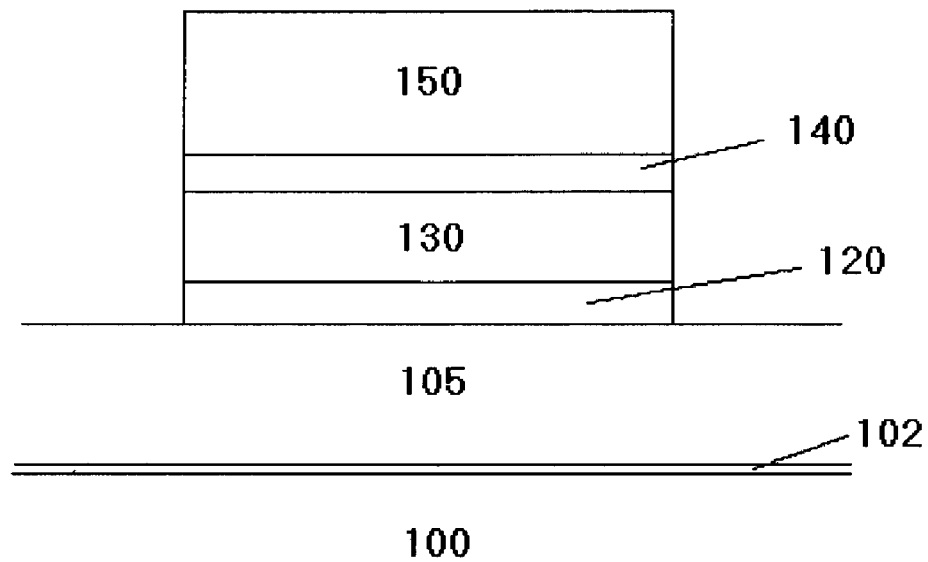
Figure 9:
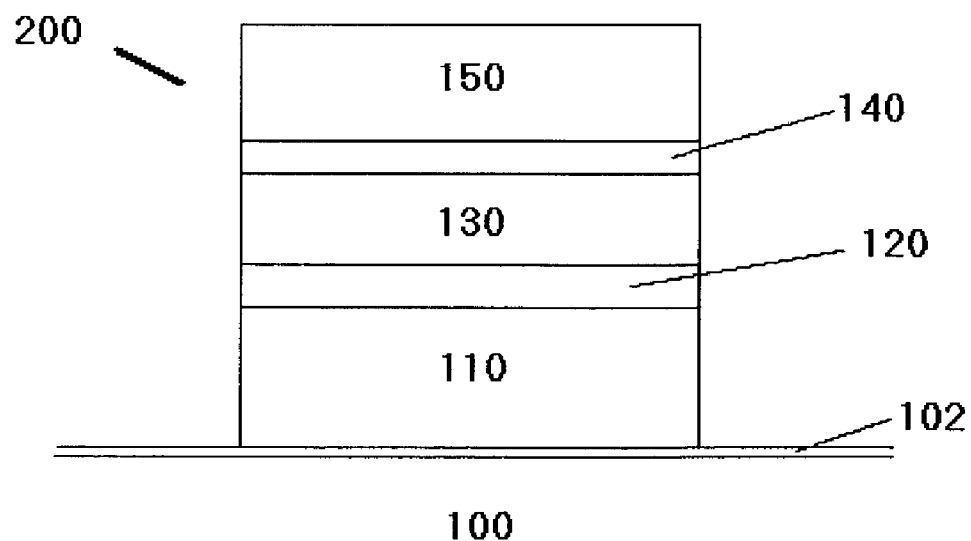
FIG. 9 shows a gate stack of the present invention.

Referring to FIG. 8, the patterned etch-stop layer may be used as a hard mask for the etching of the metallic layer 125 (FIG. 7) to form a patterned metallic layer 130. Referring to FIG. 9, the patterned etch-stop layer and the patterned metallic layer may be used as a hard mask for the etching of the gate layer 105 (FIG. 8) to form patterned gate layer 110. The gate etching may be carried out by conventional gate etch techniques, for example by exposure to a plasma formed from chlorine, hydrobromic acid and/or oxygen.

The patterned photoresist 210 (FIG. 6) may be removed at any stage of the gate stack formation following the etch-stop etch. For example, the patterned photoresist may be removed immediately after the etch-stop etch (as illustrated in FIGS. 6 and 7), or it may be removed after the etching of the metallic layer or after the gate etching. The removal of the photoresist may be followed by a cleaning procedure to ensure removal of any residual byproduct of the photoresist or of the photoresist removal. For example, the photoresist may be removed by ashing the patterned photoresist to provide a gate stack containing a patterned etch-stop layer (FIG. 7). This gate stack without a photoresist layer may then be treated with a cleaning solution to complete the removal and cleaning process.

Preferably, the cleaning agent used to clean the gate a non-oxidizing cleaning solution. The metallic layer preferably contains an easily oxidized metal, more preferably the metallic layer contains tungsten or tungsten nitride or an alloy or compound of tungsten or titanium.

More preferably, the cleaning agent includes (a) an amino alcohol or amino ether; (b) an aromatic alcohol, aliphatic polyol, or aliphatic polyol ether; and (c) a hydroxylamine. More than one of each component (a), (b) and (c) may be present. Preferably, the cleaning agent is an aqueous solution. The most preferred cleaning agent contains water, 2-(2 aminoethoxy)ethanol, hydroxylamine, and catechol.

The first component of the cleaning agent (a) is an amino alcohol or amino ether. The term "amino alcohol" is any compound which includes both an amino moiety and an —OH moiety, which are not directly bonded to each other. An amino ether is an ether of an amino alcohol. Preferably, the amino alcohol is an amino alkoxy alcohol, i.e. an amino alcohol that contains one or more ether linkages between alkylene moieties which are attached the amino moiety and the —OH moiety. Preferably, the amino alkoxy alcohol has 2-12 carbon atoms. Below are illustrated a variety of amino alcohols and amino ethers. Preferably R in the formulas is an alkyl group of 1-6 carbon atoms.

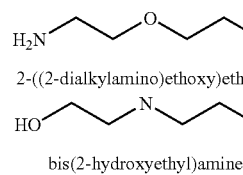
2-((2-dialkylamino)ethoxy)ethanol

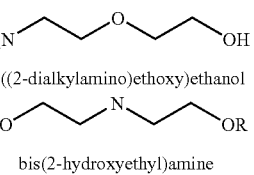
2-((2-dialkylamino)ethoxy)ethanol bis(2-hydroxyethyl)amine bis(2-hydroxyethyl)amine monoalkyl ether

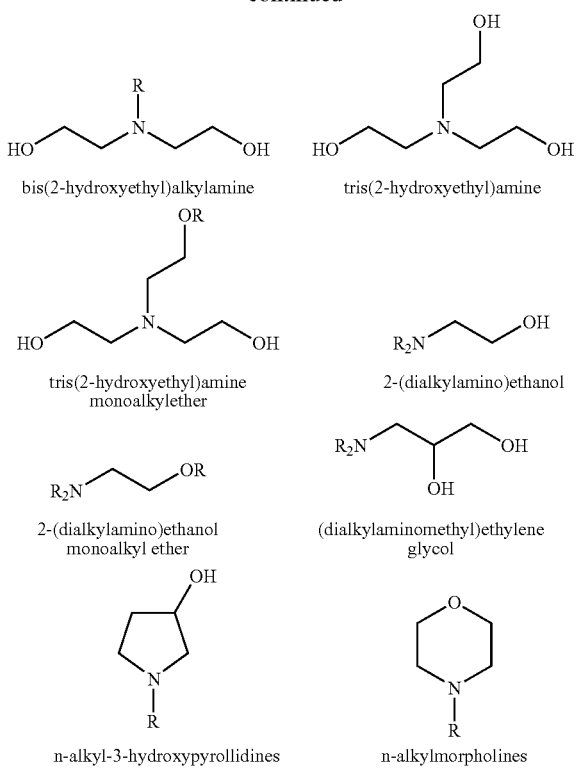

bis(2-hydroxyethyl)alkylamine tris(2-hydroxyethyl)amine tris(2-hydroxyethyl)amine monoalkylether 2-(dialkylamino)ethanol 2-(dialkylamino)ethanol monoalkyl ether (dialkylaminomethyl)ethylene glycol n-alkyl-3-hydroxypyrollidines n-alkylmorpholines The second component of the cleaning agent (b) is an aromatic alcohol, aliphatic polyol, or aliphatic polyol ether. An aromatic alcohol is a compound which contain an aromatic moiety and an —OH moiety. Preferably, the aromatic alcohol is an aromatic diol or triol, more preferably the aromatic moiety is a phenyl group unsubstituted or with alkyl substituents having 1-3 carbon atoms, most preferably the —OH moiety is directly bonded to the phenyl group. An aliphatic polyol is a compound having at least two —OH moieties and no unsaturated carbon atoms. An aliphatic polyol ether is any ether of an aliphatic polyol. Preferably, the aliphatic polyol or aliphatic polyol ether contains 2-12 carbon atoms. Below are illustrated a variety of aromatic alcohols, aliphatic polyols, and aliphatic polyol ethers. Preferably R in the formulas is an alkyl group of 1-6 carbon atoms.

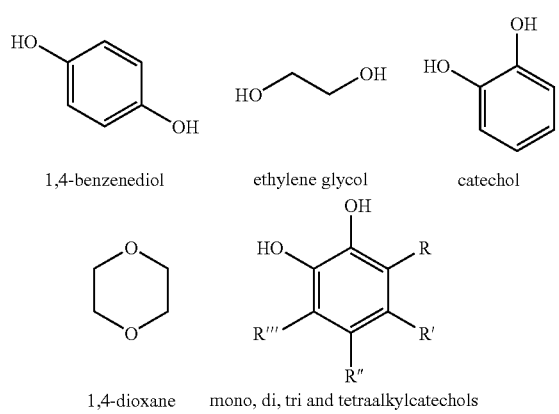

1,4-benzenediol ethylene glycol catechol 1,4-dioxane mono, di, tri and tetraalkylcatechols

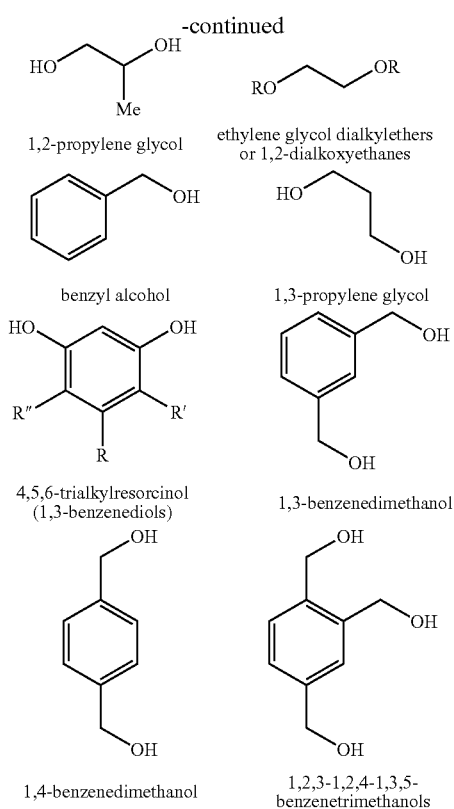

The third component is (c) a hydroxylamine. The term "hydroxyl amine" includes all compounds that contain an —OH moiety bonded directly to an —NH— moiety, for example hydroxylamine and alkylhydroxyl amines. Preferably the hydroxyl amine is hydroxylamine or an alkylhydroxyl amine, more preferably hydroxylamine or an alkylhydroxyl amine containing 1-6 carbon atoms.

Preferably, the cleaning is carried out at a temperature of at most 65° C., more preferably at a temperature of at most 50° C. Preferably, the cleaning is followed by rinsing with water. Preferably the cleaning is carried out by spraying the cleaning solution on the semiconductor structure, more preferably while spinning the structure. Preferably the structure is dried after cleaning with an inert gas, such as nitrogen or argon.

FIG. 9 thus illustrates a gate stack 200 which may be formed on a semiconductor wafer. Semiconductor substrate 100 supports a gate insulating layer 102, which in turn supports a gate layer 110. The gate layer supports a metallic layer 130, which may optionally be separated from the gate layer by barrier layer 120. The metallic layer may optionally support a barrier layer 140. The etch-stop layer 150 is on the metallic layer 130, or optionally on the layer 140 above the metallic layer.

Figure 10:
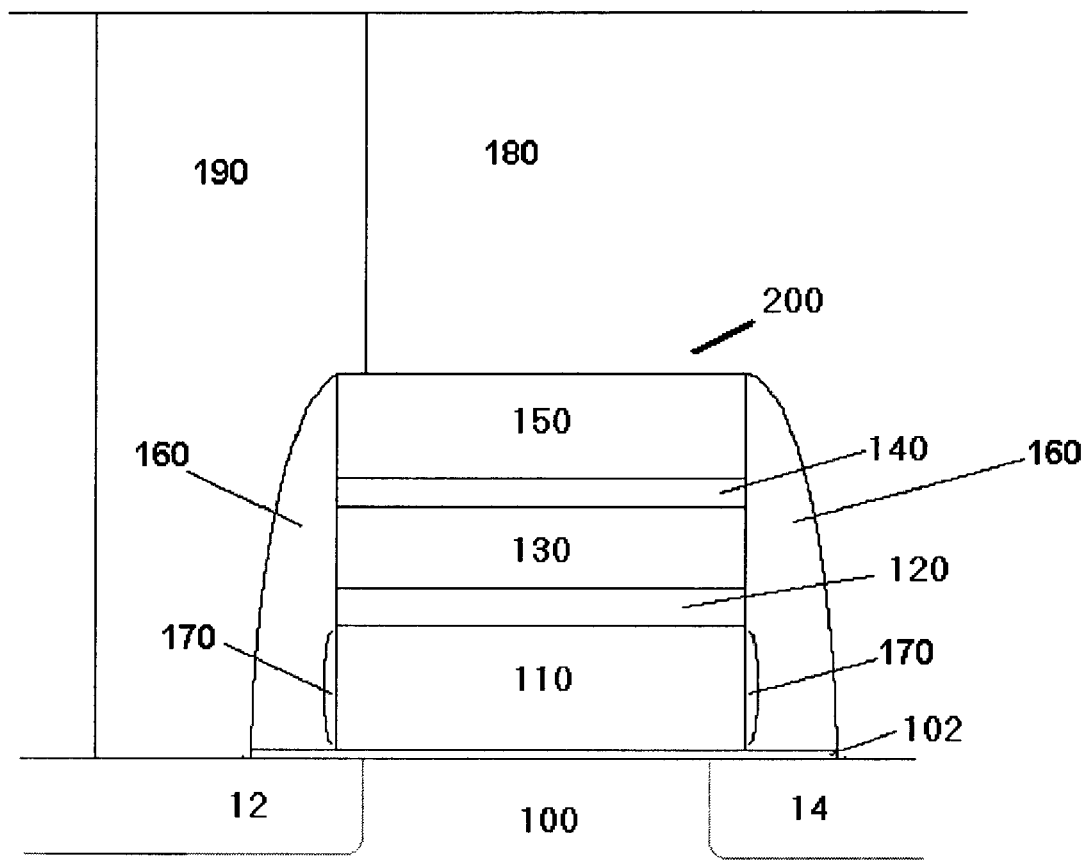
FIG. 10 show the gate stack of FIG. 9 after further processing.

Further processing of the gate structure may include forming sidewall oxide regions 170 on gate layer 110 and forming spacers 160 (preferably containing nitride) on the sides of the stack. Furthermore, a dielectric layer 180 maybe formed on the etch-stop layer, and contacts or via 190 formed through the dielectric to the substrate, as illustrated in FIG. 10. This via may be lined and filled to form a via-contact, for example with TiN and tungsten, respectively. Other processing may include forming contacts to the gate itself. After dielectric layer is formed, the etch-stop layer has a thickness of at least 800 angstroms, preferably at least 1100 angstroms, so that it may be used to allow formation of SAC.

Other processing may be used to complete formation of semiconductor devices from the semiconductor structure. For example, source/drain regions 12, 14 may be formed in the substrate, additional dielectric layers may be formed on the substrate, and contacts and metallization layers may be formed on these structures. These additional elements may be formed before, during, or after formation of the gate stack.

The related processing steps, including the etching of the gate stack layers and other steps such as polishing, cleaning, and deposition steps, for use in the present invention are well known to those of ordinary skill in the art, and are also described in Encyclopedia of Chemical Technology, Kirk-Othmer, Volume 14, pp. 677-709 (1995); Semiconductor Device Fundamentals, Robert F. Pierret, Addison-Wesley, 1996; Wolf, Silicon Processing for the VLSI Era, Lattice Press, 1986, 1990, 1995 (vols 1-3, respectively), and Microchip Fabrication 4rd. edition, Peter Van Zant, McGraw-Hill, 2000.

The semiconductor structures of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, an airplane or an automobile.

EXAMPLE

Example 1

Formation of a Gate Structure

The following detailed steps were used to form the gate stack having a split gate:

Nitrogen-containing gate oxide formation
Poly deposition - single amorphous gate deposit
Mask for P-doping
P$^+$ poly implantation
N-well implantation
P-channel implantation
P$^+$ poly implantation strip resist
Mask for N-doping
P-well implantation
N$^+$ poly implantation
N-channel implantation
N$^+$ poly implantation strip resist
Tungsten gate pre-clean
Tungsten PVD, sputtering (nitrogen+argon, then argon only)
Nitride - PECVD
Deposit ARC and Resist
Etch mask for nitride
Nitride etch - ARC, silicon nitride, and partial tungsten etch
Remove resist
Tungsten and Poly etch
Post-poly etch clean
Selective oxidation
N$^+$ source/drain extension implant
Stripping & cleaning
P$^+$ source/drain extension implant
Stripping & cleaning
Nitride spacer deposition (BTBAS chemistry)
Spacer etch
Post-spacer etch clean
N$^+$ source/drain implant
Stripping & cleaning -continued P+ source/drain implant
Stripping & cleaning
Nitride-poly cut mask etch and clean
Dielectric deposition/planarization/mask for contacts
self-aligned contact (SAC) etch
SAC etch clean Bottom anti-reflective coating (BARC) was etched under the following conditions: $CF_4$ flow rate of 100 sccm, Ar flow rate of 100 sccm, power of 600 W, bias of 75 W, a pressure of 16 mTorr, and a temperature of 60° C. Temperature is controlled, for example, by He backside cooling during the BARC etch, as well as in subsequent steps.

The resist was then trimmed under the following conditions: HBr flow rate of 160 sccm, $O_2$ flow rate of 28 sccm, power of 400 W, a pressure of 8 mTorr, a temperature of 60° C., and for a time of 10 seconds. Alternatively, the resist was trimmed under the following conditions: HBr flow rate of 169 sccm, $O_2$ flow rate of 19 sccm, power of 400 W, a pressure of 8 mTorr, a temperature of 60° C., and for a time of 5 seconds.

Etching of the nitride was carried out with a plasma at a pressure of 30 mTorr, at a power of 500 W, a bias of 100 W, and at a temperature of 60-65° C. The gas composition is $CHF_3$ at 275 sccm and $CF_4$ at 300 sccm. An overetch of 20% was used.

The tungsten was partially etched under the following conditions: $NF_3$ flow rate of 10 sccm, $Cl_2$ flow rate of 25 sccm, $O_2$ flow rate of 5 sccm, Ar flow rate of 50 sccm, $N_2$ flow rate of 30 sccm, He flow rate of 150 sccm, power of 800 W, bias of 60 W, a pressure of 4 mTorr, a temperature of 60° C., and for a time of 10 seconds.

Resist material was removed by ashing (for example at 80° C. with a mixture of $CF_4$ and $O_2$), and the stack was cleaned by treating the wafer with EKC265™ (EKC, Hayward, Calif.; a mixture of 2-(2 aminoethoxy)ethanol, hydroxylamine and catechol) by spinning with spraying (using a spray tool) at 65 or 70° C. for 10 minutes, then 2 minutes at 20° C., followed by rinsing with deionized water, to prevent undesirable oxidation of the tungsten. This clean may be used for any stripping and cleaning step where tungsten or tungsten nitride is exposed to prevent undesirable oxidation. Also, the clean may be carried out with downstream plasma ashing under the following conditions, followed by washing with water: step 1: $CF_4$ flow rate of 50 sccm, $H_2O$ flow rate of 160 sccm, $N_2/H_2$ flow rate of 1400 sccm, power of 1050 W, bias of 100 W, a pressure of 750 mTorr, a temperature of 80° C., and for a time of 30 seconds; step 2: $NF_3$ flow rate of 40 sccm, $H_2O$ flow rate of 170 sccm, $O_2$ flow rate of 170 sccm, bias of 150 W, a pressure of 250 mTorr, a temperature of 80° C., and for a time of 120 seconds.

The tungsten was then etched under the following conditions: $NF_3$ flow rate of 15 sccm, $Cl_2$ flow rate of 25 sccm, $O_2$ flow rate of 5 sccm, Ar flow rate of 50 sccm, $N_2$ flow rate of 30 sccm, He flow rate of 150 sccm, power of 800 W, bias of 35 W, a pressure of 4 mTorr, and a temperature of 60° C. An overetch of the tungsten was carried out for 5 seconds. The system was then pumped down for 20 seconds.

The poly was then etched under the following conditions: HBr flow rate of 250 sccm, He(80%)/$O_2$(20%) flow rate of 12 sccm, power of 450 W, a bias of 40 W, a pressure of 25 mTorr, and a temperature of 60° C. A poly overetch was carried out under the following conditions: HBr flow rate of 150 sccm, He(80%)/$O_2$(20%) flow rate of 8 sccm, He flow rate of 100 sccm, power of 200 W, a bias of 70 W, a pressure of 70 mTorr, a temperature of 60° C., and for a time of 63 seconds. Alternatively, the poly overetch was carried out under the following conditions: HBr flow rate of 150 sccm, He(80%)/$O_2$(20%) flow rate of 13 sccm, He flow rate of 200 sccm, power of 250 W, a bias of 60 W, a pressure of 80 mTorr, a temperature of 60° C., and for a time of 53 seconds. Cleaning may be carried out as described above, or for example, by downstream, followed by rinsing with water (for example with deionized water for 7 cycles), under the following conditions: $CF_4$ flow rate of 40 sccm, $O_2$ flow rate of 1000 sccm, $H_2O$ flow rate of 200 sccm, $N_2$ flow rate of 150 sccm, power of 1700 W, a pressure of 700 mTorr, a temperature of 70° C., and for a time of 80 seconds.

The exposed sides of the poly were covered with a layer of oxide about 50-70 angstroms thick by the selective oxidation. This was carried out by exposing the stack to a mixture of hydrogen and oxygen (10% steam) at a temperature of 750° C. to selectively oxidize the poly relative to the tungsten and tungsten nitride.

BTBAS was used to form a nitride layer for spacer formation under the following conditions: BTBAS flow rate of 50 sccm, $NH_3$ flow rate of 100 sccm, a pressure of 150 mTorr, and a temperature of 550° C.

Etching of the nitride (nitride-poly cut mask etch and clean) was carried out with a plasma at a pressure of 35 mT, at a power of 280 W, and a temperature of 15° C. The gas composition for the main etch was $CHF_3$ at 30 sccm, Ar at 60 sccm, and $O_2$ at 10 sccm. The clean was carried out with plasma ashing in two steps, followed by a solvent clean:

Step 1:
pressure of 2 mTorr, temperature of 185° C., microwave power of 800 W, gas: $O_2$ at 3750 sccm, $N_2$ at 375 sccm;

Step 2:
same values, except a temperature of 200° C. and microwave power of 1400 W.

Etching to form contacts (SAC etch) was carried out with a plasma at a pressure of 55 mTorr, a power of 500 W, a temperature of 35° C., with the magnet at 20 Gauss, a gas of $CF_4$ at 5 sccm, $CHF_3$ at 10 sccm, $C_2H_2F_4$ at 10 sccm, and Ar at 90 sccm, as the ARC etch; and as the main etch a pressure of 55 mTorr, a power of 500 W, a temperature of 35° C., with the magnet at 25 Gauss, a gas of $CHF_3$ at 80 sccM, $C_2H_2F_4$ at 8 sccm, and Ar at 90 sccm. The clean was carried out with plasma ashing in two steps, followed by a solvent clean:

Step 1:
pressure of 400 mTorr, temperature of 20+/−5° C., RF power of 420 W, gas: $O_2$ at 400 sccm.

Step 2:
pressure of 750 mTorr, temperature of 20+−5° C., RF power of 420 W, gas: $N_2$ at 400 sccm, $H_2$ at 400 sccm, and $NF_3$ at 5 sccm; or alternatively:

pressure of 750 mTorr, temperature of 40+/−5° C., RF power of 350 W, gas: $CF_4$ at 20 sccm, $N_2$/5% $H_2$ at 200 sccm, and $O_2$ at 500 sccm.

SAC etch clean was carried out using EKC 265™, with a spray tool: temperature of 70° C. for 10 minutes, and an extra 2 minutes at 20° C., followed by rinsing with deionized water and then spin drying in $N_2$; then washed with $H_2SO_4$ at 150° C. twice for 10 minutes each and then spin drying in $N_2$.

In the stack, the silicon nitride layer had a thickness of 1300 angstroms (although the actual amount deposited was greater since silicon nitride is lost during the poly etch and during spacer etch), the tungsten layer had a thickness of 325 angstroms, the tungsten nitride layer had a thickness of 75 angstroms, and the poly layer had a thickness of 735 angstroms. The contacts having a width of 0.13 microns at the top, and a width of 0.05 microns at the bottom.

Patent application Ser. No. 10/314,380, entitled "MULTI-LAYERED GATE STACK" by Saurabh Dutta Chowdhury, Cypress ref. PM02012, filed on the same day as the present application, is hereby incorporated by reference.

The invention claimed is:

1. A method of making a semiconductor structure, comprising:
   cleaning a gate stack with a cleaning solution;
   wherein the gate stack comprises a gate layer, a metallic layer on the gate layer, and an etch-stop layer on the metallic layer,
   the gate layer is on a semiconductor substrate,
   the cleaning solution is a non-oxidizing cleaning solution,
   the metallic layer comprises an easily oxidized metal, and
   the cleaning solution consists essentially of:
      (a) at least one member selected from the group consisting of an amino alcohol and amino ether,
      (b) at least one member selected from the group consisting of an aromatic alcohol, aliphatic polyol, and aliphatic polyol ether, and
      (c) a hydroxyl amine.

2. The method of claim 1, wherein the metallic layer comprises tungsten or titanium.

3. The method of claim 1, wherein the cleaning solution consists essentially of:
   (a) an amino alkoxy alcohol having 2-12 carbon atoms,
   (b) an aromatic diol or triol, and
   (c) hydroxylamine or an alkylhydroxylamine containing 1-6 carbon atoms.

4. The method of claim 1, wherein the cleaning solution consists essentially of 2-(2 aminoethoxy)ethanol, hydroxylamine, and catechol.

5. The method of claim 1, wherein the etch-stop layer has a thickness of at least 1100 angstroms.

6. The method of claim 1, further comprising, prior to the cleaning:
   applying a photoresist on the etch-stop layer;
   patterning the photoresist; and
   etching the etch-stop layer.

7. The method of claim 6, further comprising ashing the photoresist prior to the cleaning.

8. A method of making a semiconductor device, comprising:
   forming a semiconductor structure by the method of claim 1, and
   forming a semiconductor device from the semiconductor structure.

9. A method of making an electronic device, comprising:
   forming a semiconductor device by the method of claim 8, and
   forming an electronic device comprising the semiconductor device.

10. A method of making a semiconductor structure, comprising:
    cleaning a gate stack comprising a metallic layer with a solution;
    wherein the metallic layer is on a gate layer,
    the gate layer is on a semiconductor substrate,
    an etch-stop layer is on the metallic layer,
    the metallic layer comprises tungsten and has a thickness of at most 450 angstroms, and
    the cleaning solution consists essentially of:
       (a) an amino alkoxy alcohol having 2-12 carbon atoms,
       (b) an aromatic diol or triol, and
       (c) hydroxylamine or an alkylhydroxylamine containing 1-6 carbon atoms.

11. The method of claim 10, wherein the gate is on an isolation region in the substrate, and the width of the isolation region under the gate is at most 0.4 microns.

12. The method of claim 10, wherein the cleaning solution consists essentially of 2-(2 aminoethoxy)ethanol, hydroxylamine, and catechol.

13. The method of claim 10, wherein the etch-stop layer has a thickness of at least 1100 angstroms.

14. The method of claim 10, further comprising, prior to the cleaning:
    applying a photoresist on the etch-stop layer;
    patterning the photoresist; and
    etching the etch-stop layer.

15. The method of claim 14, further comprising ashing the photoresist prior to the cleaning.

16. A method of making a semiconductor structure, comprising:
    removing photoresist;
    wherein the photoresist is on a etch-stop layer,
    the etch-stop layer is on a metallic layer,
    the metallic layer has a thickness of at most 450 angstroms and is on a gate layer,
    the gate layer is on a semiconductor substrate, and
    the removing comprises ashing and applying a cleaning solution consisting essentially of:
       (a) at least one member selected from the group consisting of an amino alcohol and amino ether,
       (b) at least one member selected from the group consisting of an aromatic alcohol, aliphatic polyol, and aliphatic polyol ether, and
       (c) a hydroxylamine.

17. The method of claim 16, wherein the cleaning solution consists essentially of:
    (a) an amino alkoxy alcohol having 2-12 carbon atoms,
    (b) an aromatic diol or triol, and
    (c) hydroxylamine or an alkylhydroxylamine containing 1-6 carbon atoms.

18. The method of claim 16, wherein the cleaning solution consists essentially of 2-(2 aminoethoxy)ethanol, hydroxylamine, and catechol.

19. The method of claim 16, wherein the removing further comprises downstream plasma ashing.

20. The method of claim 16, further comprising, prior to the removing:
    applying the photoresist on the etch-stop layer;
    patterning the photoresist; and
    etching the etch-stop layer.

21. The method of claim 16, wherein the gate comprises a $P^+$ region and an $N^+$ region.

22. The method of claim 16, wherein the etch-stop layer has a thickness of at least 1100 angstroms.

* * * * *